United States Patent [19]

Kato et al.

[11] 4,275,306

[45] Jun. 23, 1981

[54] ALIGNMENT APPARATUS

[75] Inventors: Yuzo Kato; Yasuo Ogino; Ryozo Hiraga; Hideki Yoshinari, all of Yokohama; Masao Tozuka, Ohmiya; Ichiro Kano, Yokohama, all of Japan

[73] Assignee: Canon Kabushiki Kaisha, Tokyo, Japan

[21] Appl. No.: 16,165

[22] Filed: Feb. 23, 1979

[30] Foreign Application Priority Data

Feb. 27, 1978 [JP] Japan .................................. 53-21765

[51] Int. Cl.³ .......................................... G01N 21/86
[52] U.S. Cl. ..................................... 250/548; 356/401
[58] Field of Search ........................ 250/548, 557, 561; 356/399, 400, 401

[56] References Cited

U.S. PATENT DOCUMENTS

| 4,070,117 | 1/1978 | Johannsmeier et al. | 356/401 |
| 4,127,777 | 11/1978 | Binder | 250/548 |

*Primary Examiner*—David C. Nelms
*Attorney, Agent, or Firm*—Fitzpatrick, Cella, Harper & Scinto

[57] ABSTRACT

An alignment apparatus in which alignment marks on a mask and a wafer for producing a semiconductor circuit element are photoelectrically read and the positional deviation between the two alignment marks is detected and one of the mask and the wafer is parallel-moved in accordance with the detected amount to align the mask and wafer into a predetermined positional relation. This apparatus has the function of correcting any interval error which may be present between the alignment marks.

1 Claim, 10 Drawing Figures

ALIGNMENT APPARATUS

BACKGROUND OF THE INVENTION

1. Field of the Invention

This invention relates to an alignment apparatus whereby two workpieces disposed optically opposedly may be aligned into a predetermined positional relationship.

2. Description of the Prior Art

Alignment of two workpieces has often been practised in aligning a mask and a wafer for producing a semiconductor circuit element. Therefore, the following description will be made by taking the alignment of a mask and a wafer as as example.

Usually, a mask is supported by a fixed mask carrier and a wafer is supported by a wafer carrier which is parallel-movable in the directions x, y and $\theta$ with respect to the mask carrier. The mask and wafer are provided with respective alignment marks and by photoelectrically scanning these alignment marks along a predetermined scanning line, the positional relation between the standard point on the mask and a point on the wafer corresponding to the standard point on the mask is measured and, when the point on the wafer is without the allowable error range relative to the standard point on the mask, the wafer carrier is moved in a plane by driving x, y and $\theta$ motors, thereby effecting the alignment within the aforementioned allowable error range.

Alignment marks are usually provided at two locations on the mask and wafer along a predetermined standard line. The two locations are usually situated at an interval so as to be symmetrical with respect to the centers of the mask and wafer.

Whether or not the alignment between the standard point on the mask and the corresponding point on the wafer is within an allowable error range is discriminated by a circuit for discriminating a relative position signal provided by a photoelectric output. This discrimination circuit determines whether or not the corresponding point on the wafer lies within a square, circular or diamond-shaped region having the standard point on the mask as the center.

However, the interval between the two alignment marks on the mask and wafer is varied by a manufacturing error or the like. Such variation in interval is called the pitch error. When such pitch error is present, it is conceivable to enlarge the area of the region by an amount corresponding to the pitch error, but this is not desirable in that it greatly alters the allowable area.

SUMMARY OF THE INVENTION

It is therefore an object of the present invention to provide an alignment apparatus which enables alignment without greatly increasing the allowable amount of error even if a pitch error is present.

Such object may be achieved by moving said region in the direction of arrangement of the alignment marks by an amount corresponding to the pitch error.

The invention will become more fully apparent from the following detailed description thereof taken in conjunction with the accompanying drawings.

DESCRIPTION OF THE PREFERRED EMBODIMENTS

Figure 1:
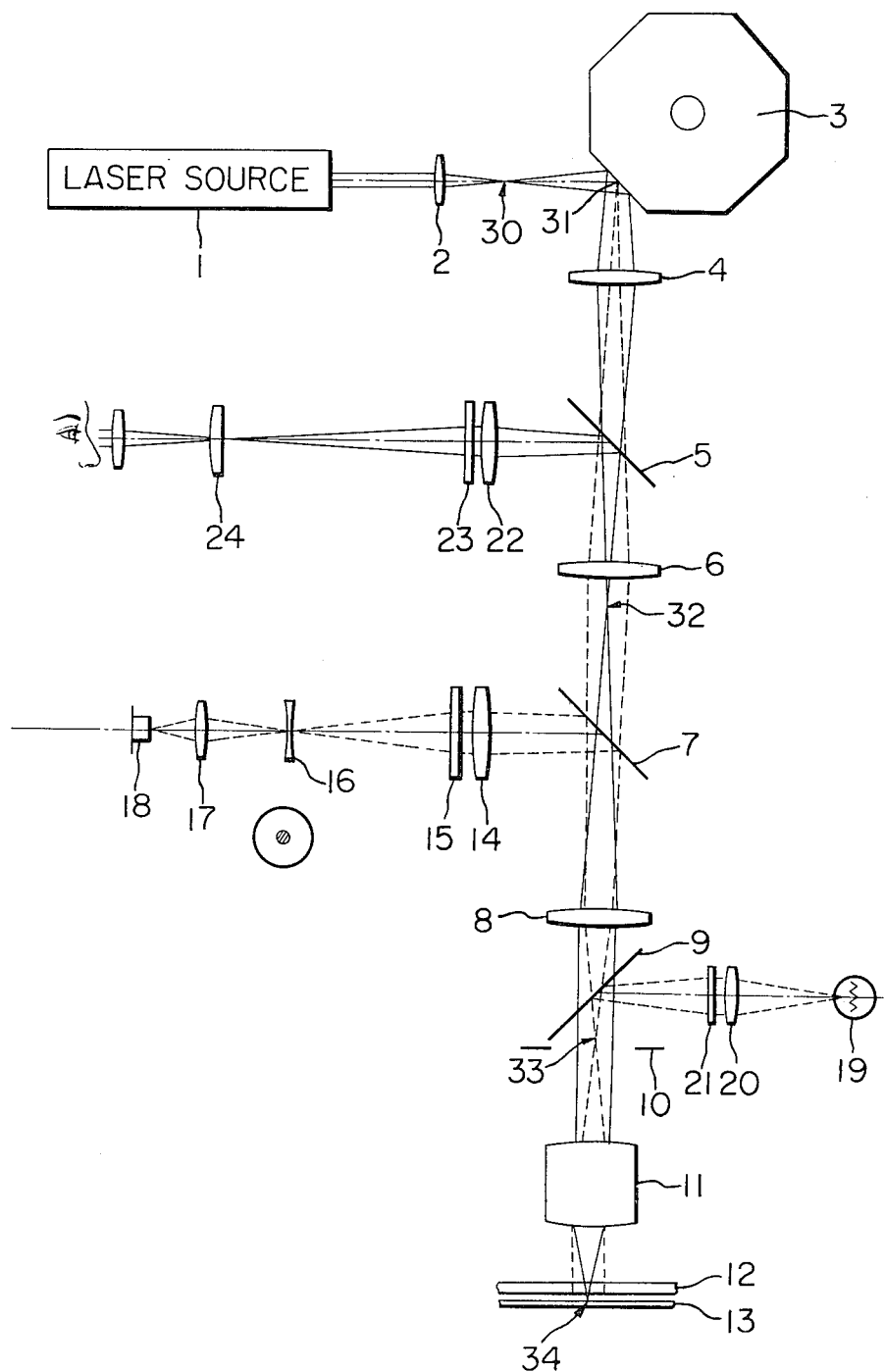
FIG. 1 illustrates the principle of an optical system for scanning by a spot light and providing a scanning signal.

Referring to FIG. 1, it shows the photoelectric detection scanning optical system of the alignment apparatus of the present invention. This optical system is similar to that disclosed in U.S. Pat. No. 4,199,219.

Figure 5:
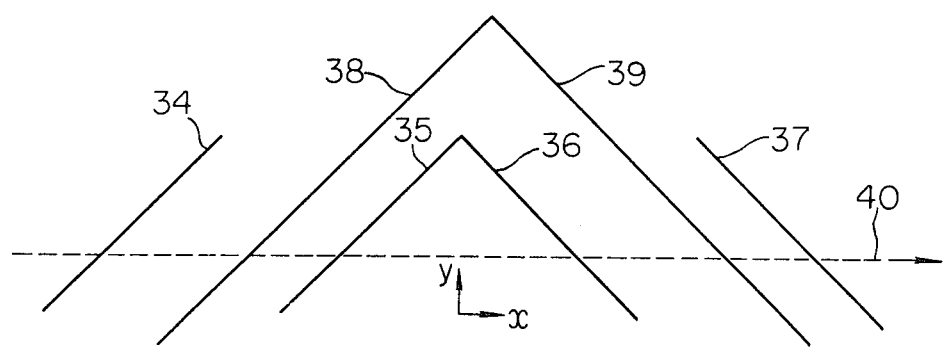
FIG. 5 shows alignment marks on the mask and wafer.

Designated by 13 is a wafer supported by a wafer carrier which is parallel-movable in the directions x, y and $\theta$ by pulse motors. Denoted by 12 is a mask supported by a fixed mask carrier. Provided on the wafer 13 are alignment marks formed by inclined surfaces as indicated by 38 and 39 in FIG. 5. These alignment marks represent the reference points of the wafer. Provided on the mask 12 are alignment marks formed by inclined surfaces as indicated by 34, 35, 36 and 37 in FIG. 5. These alignment marks represent the standard points of the mask.

Turning back to FIG. 1, reference numeral 1 designates a laser source which is non-sensitizing to the wafer 13, reference numeral 3 denotes a rotatable polygon mirror, reference numerals 4, 6 and 8 designate intermediate lenses, and reference numeral 11 denotes a telecentric objective lens. The intermediate lenses 4, 6 and 8 collimate the deflected light from the rotatable polygon mirror 3 and form the origin of deflection 33 (i.e. the origin of deviation) of the deflected light at the diaphragm position 10 of the objective lens 11. Thus, spot light scanning is effected on the mask and wafer 12 and 13 disposed in the focal plane 34 of the objective lens 11.

Designated by 7 is a beam splitter. A photoelectric detecting system is formed by this beam splitter 7. Denoted by 14 is a lens which cooperates with the lens 8 to re-form the image of the origin of deviation 33. Reference numeral 16 denotes a space filter disposed on the surface on which the re-formed image is formed. This space filter 16 has a light-intercepting portion which is of the same size as the image of the origin of deviation. Therefore, the filter 16 intercepts the reflected light from the surface perpendicular to the optic axis of the objective lens 11 and passes the reflected light from the inclined surface. Accordingly, it passes the light from the alignment marks. Designated by 17 is a condenser lens, and 18 a photodetector. An alignment mark scanning signal is provided by this photodetector with the movement of the spot.

Designated by 5 is a beam splitter. An observation system is formed by this beam splitter 5. A lens 22 cooperates with the lenses 6, 8 and 11 to form the images of the mask and wafer 12 and 13 on a field lens 24. Denoted by 9 is a half-mirror for directing the light from a light source 19 toward the mask and wafer 12 and 13.

Figure 3:
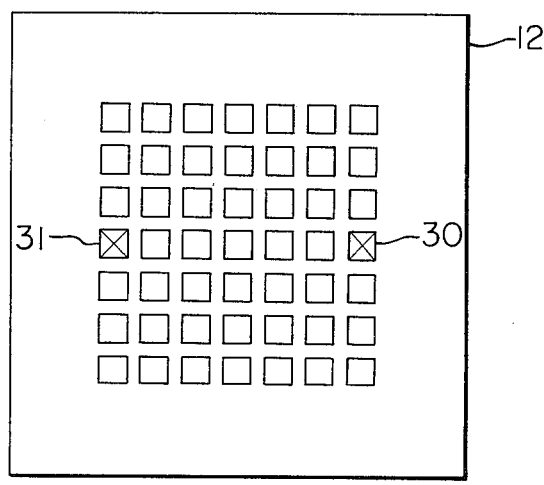
FIG. 3 shows the positions of alignment marks on a mask.
Figure 4:
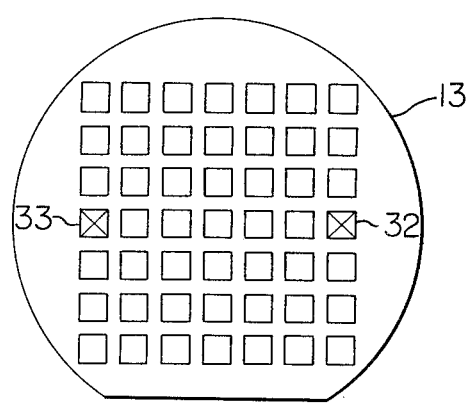
FIG. 4 shows the positions of alignment marks on a wafer.

The optical system described above shows the principle in the case where an alignment mark is provided at one location, but it is also applicable to an optical system in which alignment marks are provided at locations 30 and 31 on the surface of the mask 12 shown in FIG. 3 and at locations 32 and 33 on the surface of the wafer 13 shown in FIG. 4 so that alignment is effected at each of the locations 30 and 32 and at each of the locations 31 and 33.

Figure 2:
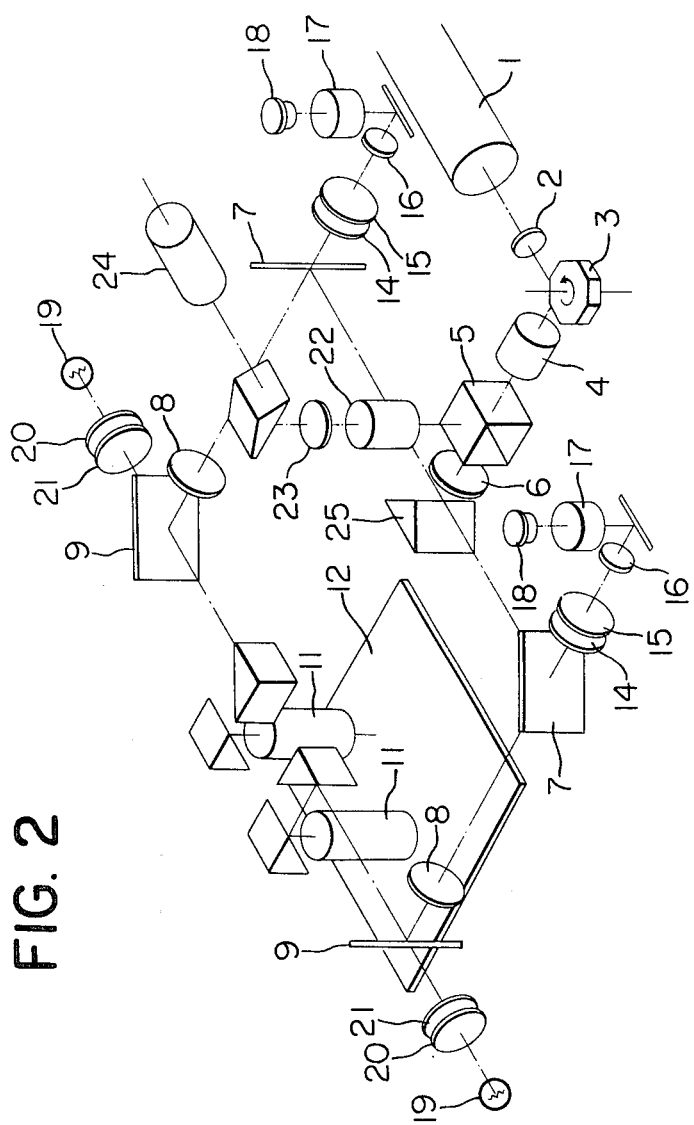
FIG. 2 illustrates the principle of an optical system for providing scanning signals from two locations.

The optical system shown in FIG. 2 is one which uses a single laser source 1 to scan the alignment marks provided at two locations.

Designated by 25 is a view field splitting mirror. Since the light deflected by the rotatable polygon mirror 3 impinges on the reflecting surfaces of the view field splitting mirror 25 at different times, the light is split in time so as to scan two locations.

Figure 7:
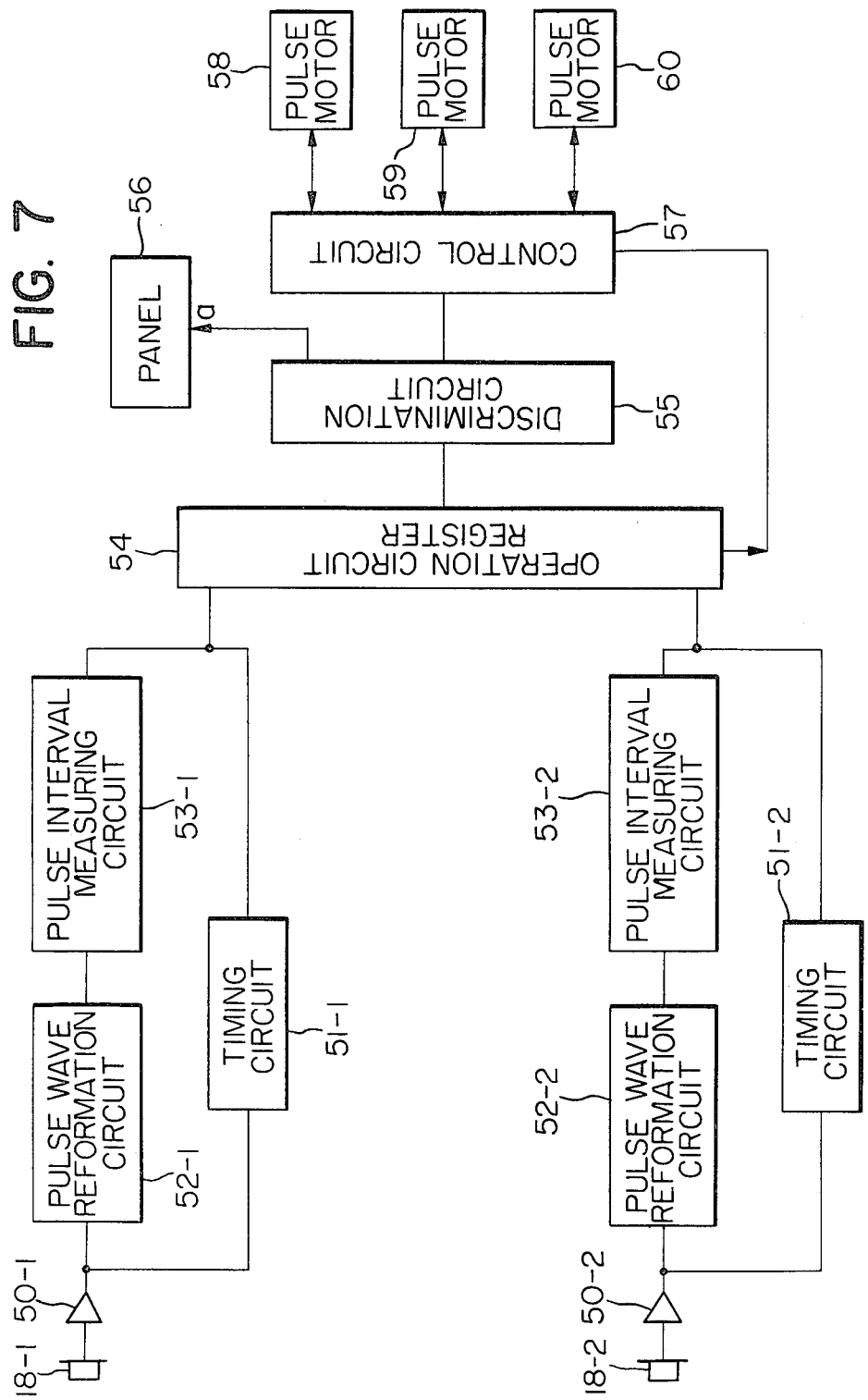
FIG. 7 is a block diagram of an electric processing unit.

FIG. 7 illustrates the principle of the electric system for measuring the amount of deviation from a predetermined positional relation between the mask and the wafer from the scanning signal detected by the photodetector and for controlling the drive of pulse motors for correcting the deviation.

The system includes photodetectors 18-1 and 18-2, preamplifiers 50-1 and 50-2, timing circuits 51-1 and 51-2, pulse wave reformation circuits 52-1 and 52-2, and pulse interval measuring circuits 53-1 and 53-2. These are two sets of circuits for treating the respective scanning signals for alignment marks.

The scanning signals detected by the photodetectors 18 are amplified by the preamplifiers 50 and applied to the timing circuits 51 and the wave reformation circuits 52.

The timing circuits 51 generate timing signals representing the start and end of the measurement and the pulse interval measuring circuits 53 and the circuit 55 are controlled by the timing signals.

Figure 6:
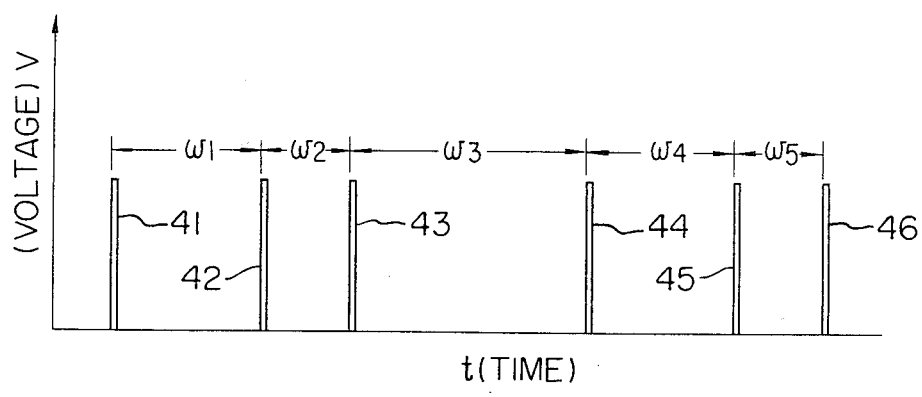
FIG. 6 illustrates the scanning signal detected from a photodetector.

The scanning signal is reformed into a pulse signal by the wave reformation circuit 52-1. FIG. 6 shows wave-reformed signals. Numerals 41, 42, 43, 44, 45 and 46 designate signals derived from the points whereat the alignment marks 34, 38, 35, 36, 39 and 37 intersect the scanning line of the spot light.

$\omega_1, \omega_2, \omega_3, \omega_4$ and $\omega_5$ are the intervals between the pulse signals and measured by the pulse interval measuring circuits 53.

The circuit 54 comprises an operation circuit for calculating the amount of deviation at the positions of the respective alignment marks and the amount driven by the pulse motor from the pulse intervals measured by the pulse interval measuring circuits 53-1 and 53-2, and a register for storing the result of the calculation.

For example, if alignment has been accomplished completely (the amount of deviation between the standard point of the mask and the reference point of the wafer is zero) when the alignment marks 38 and 39 on the wafer lie at a position which bisects the distance between the alignment marks 34 and 35 and between the alignment marks 36 and 37 on the mask, the relations between the amount of deviation with the alignment marks on the mask as the reference and the pulse intervals are given by the following equations:

$$\Delta x = \tfrac{1}{4}(\omega_1 - \omega_2 + \omega_4 - \omega_5) \quad (1)$$

$$\Delta y = \tfrac{1}{4}(-\omega_1 + \omega_2 + \omega_4 - \omega_5) \quad (2)$$

where $\Delta x$ is the amount of deviation in the direction of x-axis, namely, the amount of deviation of the reference point in the direction x with respect to the mask standard point, and $\Delta y$ is the amount of deviation in the direction of y-axis, namely, the amount of deviation of the reference point in the direction y with respect to the mask standard point.

Also, the amounts driven by the pulse motors are given as follows:

$$X = -\tfrac{1}{2}(\Delta x_1 + \Delta x_2) \quad (3)$$

$$Y = -\tfrac{1}{2}(\Delta y_1 + \Delta y_2) \quad (4)$$

$$\text{\textcircled{H}} = -1/D(\Delta y_1 - \Delta y_2) \quad (5)$$

where $\Delta x_1, \Delta x_2, \Delta y_1$ and $\Delta y_2$ are the amounts of deviation measured at the positions of the respective alignment marks, D is the interval between the alignment marks, and X, Y and $\text{\textcircled{H}}$ are the amounts driven in the direction of x-axis, the direction of y-axis and the direction of rotation by the pulse motors.

Figure 8:
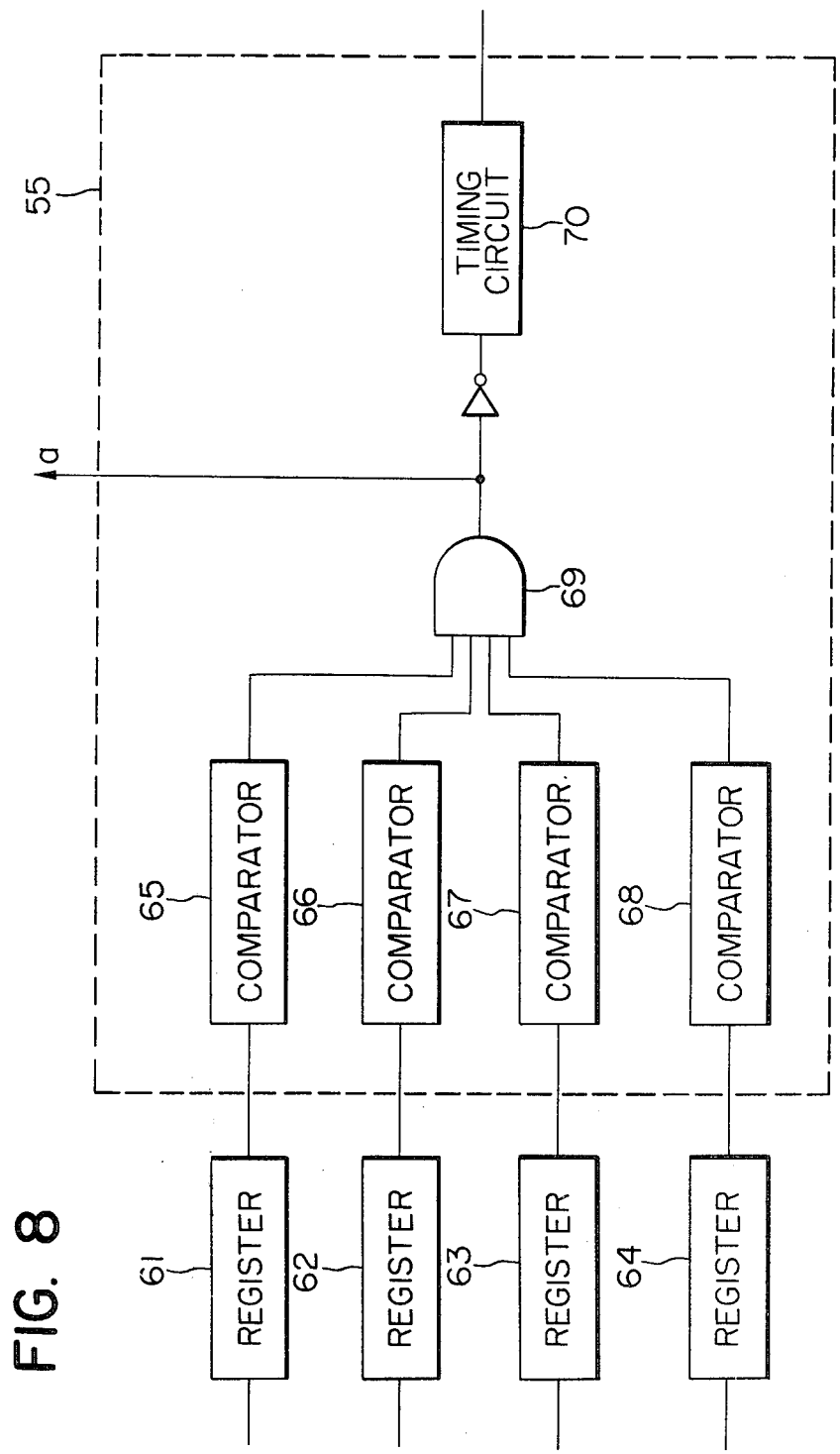
FIG. 8 shows a discrimination circuit.

A discrimination circuit 55 is a circuit for discriminating whether the magnitude of the deviation calculated by the operation circuit is within an allowable value or not, and the details thereof are shown in FIG. 8.

In FIG. 8, registers 61, 62, 63 and 64 have stored therein the values of $|\Delta x_1 + \Delta y_1|$, $|\Delta x_1 - \Delta y_1|$, $|\Delta x_2 + \Delta y_2|$ and $|\Delta x_2 - \Delta y_2|$, respectively.

Designated by 65, 66 and 67 are comparators which produce positive signals when the following relations are satisfied:

$$|\Delta x_1 + \Delta y_1| \leq T \quad (6)$$

$$|\Delta x_1 - \Delta Y_1| \leq T \quad (7)$$

$$|\Delta x_2 + \Delta y_2| \leq T \quad (8)$$

$$|\Delta x_2 - \Delta y_2| \leq T \quad (9)$$

where T is a value allowing the amounts of deviation in the directions x and y with the mask standard point as the origin, and is also discussed in application Ser. No. 14.359.

Designated by 69 is a four-input AND circuit.

The output of the AND circuit 69 puts out a positive signal when all the relations (6) to (9) are satisfied and this signal provides a signal for turning on a lamp provided on the panel of the apparatus. The turn-on of this lamp indicates to the operator that the mask and wafer have been properly aligned.

A timing circuit 70 produces a timing signal for the circuit 57 which controls the pulse motors.

The control circuit 57 controls the speeds, the amounts of feed and the starting time of the pulse motors 58, 59 and 60 for moving the wafer in the directions of x-axis, y-axis and $\theta$ by the amounts of X, Y and $\text{\textcircled{H}}$, respectively, calculated by the operation circuit 54.

While the foregoing description has been made on the premise that the interval between the alignment marks on the wafer is invariable, such interval is variable with the error of the manufacture, temperature variations, etc. The variation in such interval is called the pitch error. When such pitch error is present, it is considered to enlarge the area of the tolerance region in accordance with that pitch error. However, this method is not desirable because it greatly alters the amount of allowable error.

Description will hereinafter be made of an embodiment which covers the pitch error.

Figure 9:
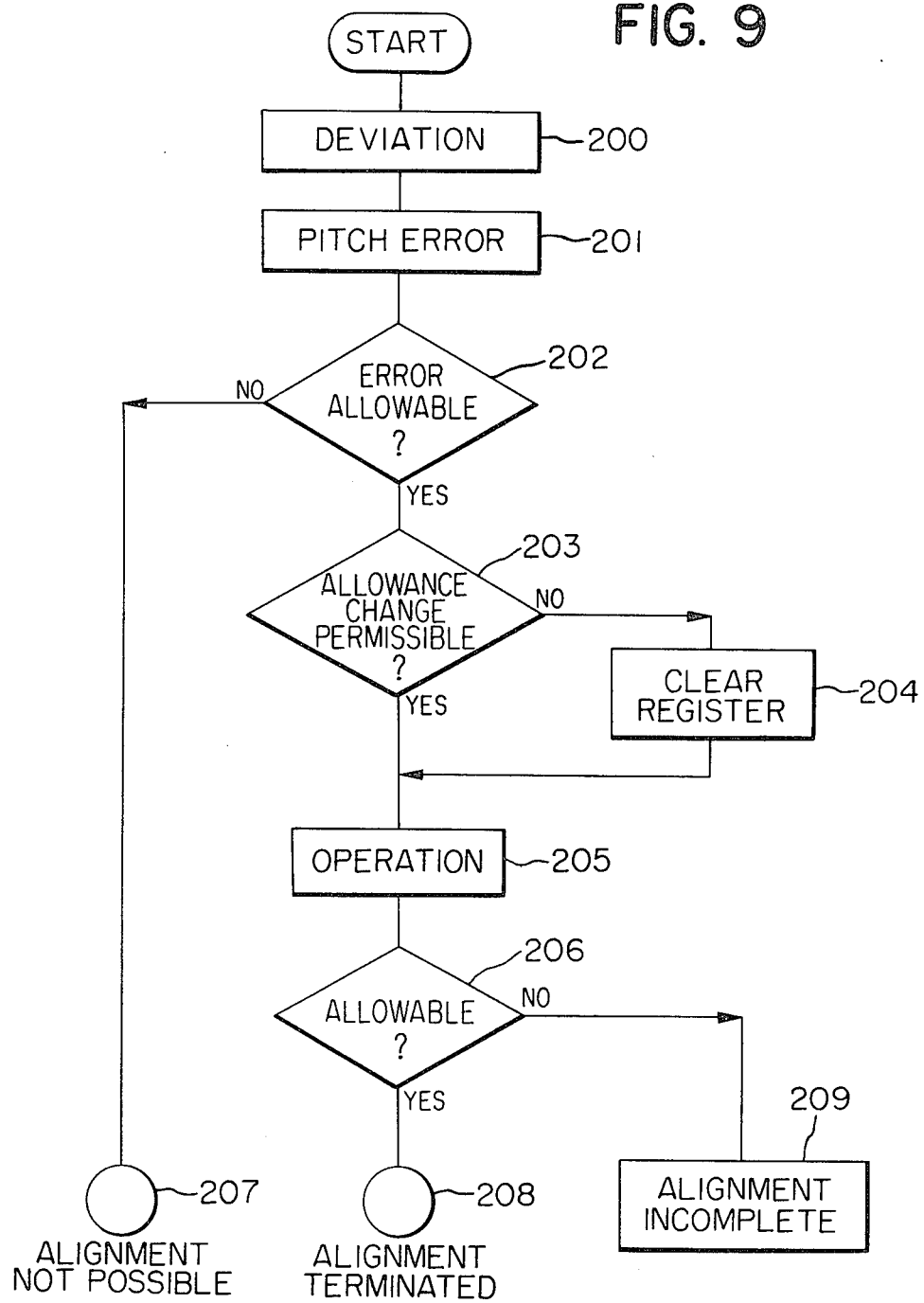
FIG. 9 is a flow chart relating to an embodiment which covers the pitch error.
Figure 10:
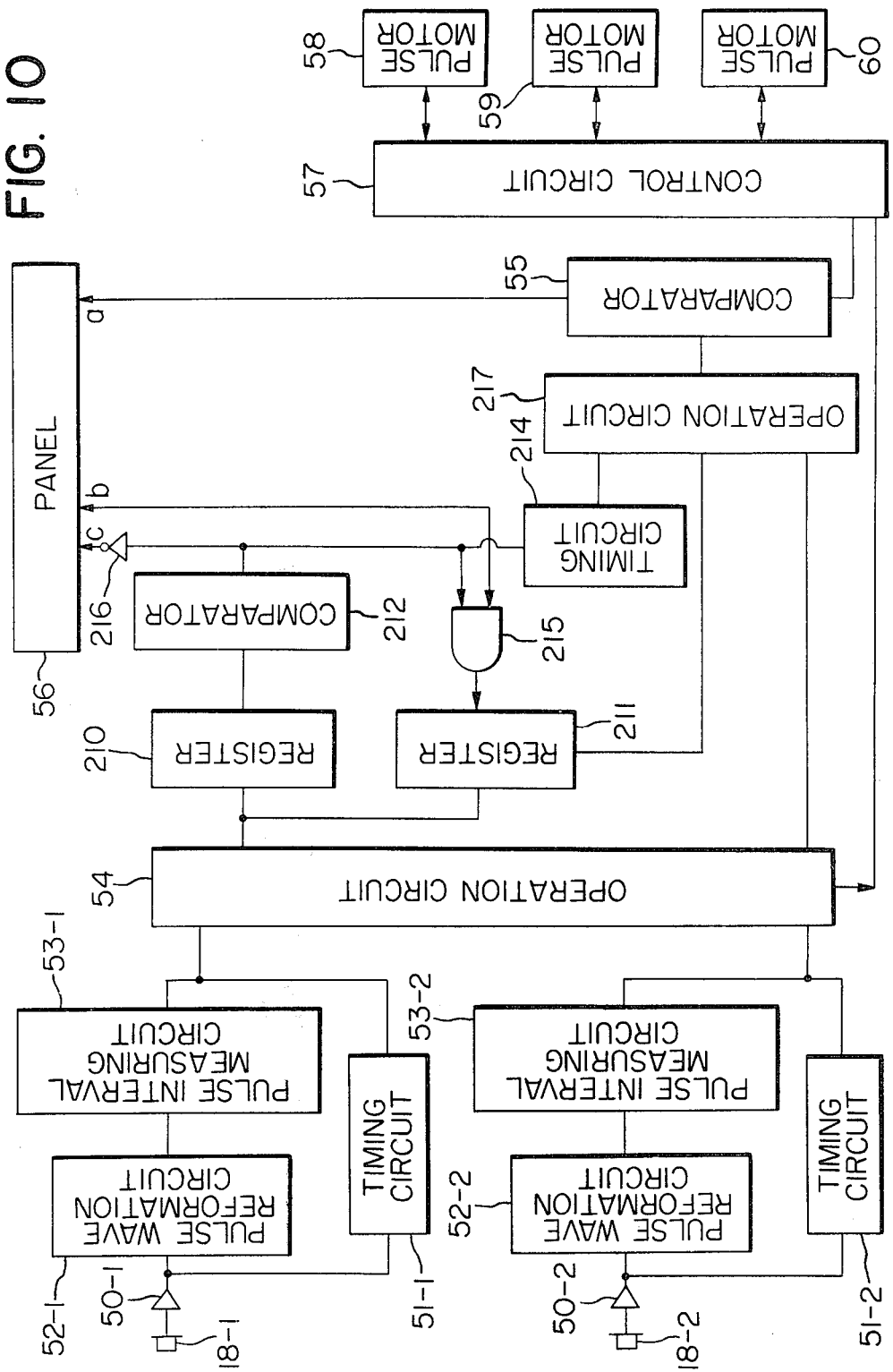
FIG. 10 is a block diagram of the electric processing unit relating to an embodiment which covers the pitch error.

FIG. 9 illustrates the process in which the amount of deviation is calculated and whether the value thereof is within an allowable value or not is discriminated.

The circuit 200 calculates the amount of deviation according to equations (1) and (2) from the pulse interval.

The circuit 201 calculates the pitch error $$Ep = \tfrac{1}{2}(\Delta x_1 - \Delta x_2) \qquad (10)$$

from the amount of deviation.

The circuit 202 discriminates whether or not the pitch error Ep is within a predetermined allowable value.

The circuit 203 determines whether or not the operator allows a change in the allowance by the pitch error Ep and when the change is not allowed, clears the register 204 which has stored therein the pitch error Ep.

The circuit 205 effects the operations of the following formulas (11) to (14):

$$|\Delta x_1 - Ep + \Delta y_1| \qquad (11)$$

$$|\Delta x_1 - EP - \Delta y_1| \qquad (12)$$

$$|\Delta x_2 + Ep + \Delta y_2| \qquad (13)$$

$$|\Delta x_2 + Ep - \Delta y_2| \qquad (14)$$

The circuit 206 discriminates whether or not all the values of formulas (11) to (14) are within allowable values.

The circuit 207 indicates that alignment is not possible because the pitch error exceeds the allowable value thereof.

The circuit 208 indicates termination of alignment.

The circuit 209 indicates it to the circuit for driving the pulse motors that the alignment is incomplete.

The circuit for carrying out the flow chart of FIG. 9 will now be described.

The signal processing portion for measuring the pulse interval from the scanning signal detected by the photodetector is identical to that of the previous embodiment.

In the present embodiment, the operation circuit 54 calculates the amounts of deviation $\Delta x_1$, $\Delta y_1$, $\Delta x_2$ and $\Delta y_2$ at the positions whereat respective alignment marks are provided, the amounts X, Y and ⓗ driven by the pulse motors, the pitch error Ep and the value of its magnitude |Ep|, whereafter the value of the pitch error |Ep| is stored in the register 210 and the value of the pitch error Ep is stored in the register 211.

Designated by 212 is a comparator which puts out a positive signal when the pitch error |Ep| is below the allowable value.

By the output signal C of an inverter 216, it is indicated on a panel 56 that alignment is not possible because the pitch error is greater than its allowable value. Whether or not a change is allowed in the tolerance of the error resulting from the pitch error is applied as a signal b by the operator through a switch on the panel.

When a change is not allowed in the tolerance, the signal b is a positive signal, and the output of the AND circuit 215 is a positive signal only when the pitch error is within its allowable value and no change is allowed in the tolerance, thereby clearing the content of the register in which the pitch error Ep is stored.

Designated by 214 is a timing circuit for producing the timing signal for the operation circuit 217. The operation circuit 217 calculates the formulas (11), (12), (13) and (14) from the amounts of deviation $\Delta x_1$, $\Delta y_1$, $\Delta x_2$ and $\Delta y_2$ calculated by the operation circuit 54 and from the value of the register 211, and causes the respective values to be stored in the registers 61, 62, 63 and 64 shown in FIG. 8.

The comparator 55, the pulse motor control circuit 57 and the pulse motors 58, 59 and 60 are similar in function to conventional ones.

The comparator 55 determines whether or not the following relations are satisfied:

$$|\Delta x_1 - Ep + \Delta y_1| \leq T \qquad (15)$$

$$|\Delta x_1 - Ep - \Delta y_1| \leq T \qquad (16)$$

$$|\Delta x_2 + Ep + \Delta y_2| \leq T \qquad (17)$$

$$|x_2 + Ep - \Delta y_2| \leq T \qquad (18)$$

The pulse motor control circuit 57 controls the speeds, the amounts of feed and the starting time of the pulse motors 58, 59 and 60 for moving the wafer in the directions of x-axis, y-axis and ⓗ by the amounts X, Y and ⓗ calculated by the operation circuit 54.

What we claim:

1. An alignment apparatus comprising a first support member for supporting a first sheet-like member provided with first and second alignment marks representing first and second standard points, respectively, spaced by a predetermined distance along a first standard line, a second support member for supporting a second sheet-like member provided with third and fourth alignment marks, along a second standard line, representing first and second reference points, respectively, corresponding to said standard points, driving means for moving at least one of said first and second support members relative to the other, means for scanning said alignment marks on said first and second sheet-like members substantially along said first standard line to read the alignment marks and produce signals, and circuit means for processing the signals produced by said scanning means and producing a signal to be applied to said driving means to place the first standard point and the second standard point under a predetermined positional relationship with the first reference point and the second reference point, respectively, said driving circuit including first discriminating means for discriminating whether the deviation between the first standard point and the first reference point is within a tolerable range, second discriminating means for discriminating whether the deviation between the second standard point and the second reference point is within a tolerable range, and means for changing the tolerable range for the deviation between the first standard point and the first reference point, and the tolerable range for the deviation between the second standard point and the second reference point, when the distance between the first reference point and the second reference point is not a predetermined one.

* * * * *

UNITED STATES PATENT AND TRADEMARK OFFICE
CERTIFICATE OF CORRECTION

PATENT NO. : 4,275,306
DATED : June 23, 1981
INVENTOR(S) : KATO ET AL.

It is certified that error appears in the above—identified patent and that said Letters Patent is hereby corrected as shown below:

Column 1, line 16, "as"(second occurrence) should read --an--.

Column 6, lines 19, 21, 23 and 25, in each case, "T" should be --T'--.

Signed and Sealed this

Eighth Day of September 1981

[SEAL]

Attest:

GERALD J. MOSSINGHOFF

Attesting Officer   Commissioner of Patents and Trademarks